(12) United States Patent
Yamamoto et al.

(10) Patent No.: US 8,287,804 B2
(45) Date of Patent: Oct. 16, 2012

(54) METHOD FOR RECOVERING METAL FROM TARGET AND METHOD FOR MANUFACTURING TARGET

(75) Inventors: Toshiya Yamamoto, Tsukuba (JP);
Takanobu Miyashita, Tsukuba (JP);
Kiyoshi Higuchi, Tsukuba (JP);
Yasuyuki Goto, Tsukuba (JP)

(73) Assignee: Tanaka Holdings Co., Ltd, Tokyo (JP)

( * ) Notice: Subject to any disclaimer, the term of this patent is extended or adjusted under 35 U.S.C. 154(b) by 0 days.

(21) Appl. No.: 13/139,453

(22) PCT Filed: Dec. 8, 2009

(86) PCT No.: PCT/JP2009/070518
§ 371 (c)(1),
(2), (4) Date: Jun. 13, 2011

(87) PCT Pub. No.: WO2010/071048
PCT Pub. Date: Jun. 24, 2010

(65) Prior Publication Data
US 2011/0243784 A1 Oct. 6, 2011

(30) Foreign Application Priority Data
Dec. 17, 2008 (JP) ................................. 2008-321388
Oct. 30, 2009 (JP) ................................. 2009-251361

(51) Int. Cl.
*B22F 3/10* (2006.01)
(52) U.S. Cl. ............... 419/19; 75/414; 75/10.1; 75/507; 75/626; 75/628; 75/632; 75/633; 75/634; 75/637; 75/638; 75/622; 75/623; 75/343; 75/338; 419/32

(58) Field of Classification Search .................... 419/19; 75/414
See application file for complete search history.

(56) References Cited

U.S. PATENT DOCUMENTS
4,895,592 A * 1/1990 Hatwar et al. ............... 75/10.14
5,810,907 A 9/1998 Okada et al.

FOREIGN PATENT DOCUMENTS
JP A-5-171 304 7/1993
(Continued)

OTHER PUBLICATIONS
Jan. 13, 2010 Office Action issued in JP Application No. 2009-251361 (with English translation).
(Continued)

*Primary Examiner* — Roy King
*Assistant Examiner* — Christopher Kessler
(74) *Attorney, Agent, or Firm* — Oliff & Berridge, PLC

(57) ABSTRACT

In the method for recovering a metal from a target that contains a metal and a metal oxide, the target contains a sintered body of the metal oxide after being heated under a condition of melting the metal without melting or decomposing the metal oxide. The target is heated in an upper crucible of a two-level crucible that includes the upper crucible with a through hole-formed in a bottom surface thereof, and a lower crucible disposed below the through hole, the size of the through hole being set such that it does not allow the sintered body of the metal oxide contained in the target to pass therethrough, and the melted metal is caused to flow into the lower crucible, so that the metal is separated from the metal oxide.

21 Claims, 12 Drawing Sheets

FOREIGN PATENT DOCUMENTS

| | | |
|---|---|---|
| JP | A-10-204553 | 8/1998 |
| JP | A-10-310842 | 11/1998 |
| JP | A-2000-355719 | 12/2000 |
| JP | A-2002-241865 | 8/2002 |
| JP | 2002327216 A * | 11/2002 |
| JP | A-2005-23349 | 1/2005 |

OTHER PUBLICATIONS

International Search Report dated Feb. 23, 2010 in corresponding International Application No. PCT/JP2009/070518 (with translation).

* cited by examiner

METHOD FOR RECOVERING METAL FROM TARGET AND METHOD FOR MANUFACTURING TARGET

TECHNICAL FIELD

The present invention relates to a method for recovering a metal from a target and a method for manufacturing a target. More specifically, the present invention relates to a method for recovering a metal from a target that contains a metal and a metal oxide, and to a method for manufacturing a target using a metal that is recovered by the method for recovering a metal.

BACKGROUND ART

Sputtering has widely been used for manufacture of recording media such as hard disks and optical disks.

However, a target used in a film deposition step during sputtering is only used at an amount of about 40 to 60% at most of its total mass because of the principles of the film deposition method.

Accordingly, recycling of a used target has been desired. This recycling is achieved, for example, by a wet process in which a metal is separated and recovered for each constituent element after being melted by an acid and the like. As another exemplary method of the recycling, a used target may be subjected to a refinement process of a metal that constitutes the target. However, these methods of recovery entail high cost, and are uneconomical.

In response, Patent Literature 1 suggests a method for efficiently recycling a used target. According to Patent Literature 1, a used alloy target material scrap is recycled without separation and refinement of each metal that is a raw material of the scrap, so that the target is recycled at lower cost.

More specifically, the reclamation suggested in Patent Literature 1 is realized by the following steps (i) to (iv). In step (i), a surface of the used alloy target material scrap is cleaned up. In step (ii), the used alloy target material scrap is melted by heating in an inert atmosphere, and is thereafter solidified by cooling, thereby forming an alloy ingot. In step (iii), a surface layer portion located at the top during formation of the alloy ingot is removed, and then in step (iv), the alloy ingot is pulverized, and the resultant alloy powder is subjected to sintering in an inert atmosphere.

CITATION LIST

Patent Literature

Patent Literature 1: Japanese Patent Application Laid-Open No. 2005-23349

SUMMARY OF INVENTION

Technical Problem

The method disclosed in Patent Literature 1 requires the step (i) of cleaning a surface of the used alloy target material scrap, and the step (iii) of cutting and removing a surface layer portion of an alloy ingot made of the used target (being the portion containing a large amount of oxygen atoms and accounting for about 15 to 20% by weight or more of the total weight of the alloy ingot). This means that the method in Patent Literature 1 disadvantageously requires a large number of process steps.

A cutting position at which a surface layer portion of a resultant alloy ingot is cut off and removed in the step (iii) determines the amount of impurities in a target to be recycled. More specifically, an alloy ingot made of a used target contains impurities even at a downward position away from a surface layer portion. This probably means that an alloy portion and a portion containing impurities are not separated well. Therefore, a certain amount of impurities may be left in the alloy ingot made of the used target even after the surface layer portion is removed from the alloy ingot. Further, a portion covering a wide area should be cut off and removed in order to form a recycled target with a small amount of impurities. This may cause reduction in recycling efficiency of the metal.

The technique disclosed in Patent Literature 1 relates to recycling of a certain metal constituent from a used target made of an alloy. Accordingly, there is some question as to whether the technique disclosed in Patent Literature 1 can be applied to a target containing not only a metal constituent but also a metal oxide. In this regard, as described above, the technique disclosed in Patent Literature 1 results in low efficiency even in recycling of a metal constituent from a target containing only the metal constituent. Thus, the technique disclosed in Patent Literature 1 may have difficulty in extracting a metal constituent efficiently from a target containing both the metal and a metal oxide.

The present invention has been made in view of the aforementioned problems. It is an object of the present invention to provide a method for recovering a metal from a target that contains a metal and a metal oxide with a small number of process steps and less contamination of impurities. It is also an object of the present invention to provide a method for manufacturing a target with a small number of process steps and high recycling efficiency of the metal.

The present invention allows for not only recycling of a used target, but also recycling of an unused target (such as a target left unused as a result of a problem found therein).

Solution to Problem

The method for recovering a metal from a target according to the present invention is a method for recovering a metal from a target that contains a metal and a metal oxide. The method is characterized in that the target contains a sintered body of the metal oxide after being heated under a condition of melting the metal without melting or decomposing the metal oxide. The method is also characterized by comprising: heating the target in an upper crucible of a two-level crucible that includes the upper crucible with a through hole formed in a bottom surface thereof, and a lower crucible disposed below the through hole, a size of the through hole being set such that it does not allow the sintered body of the metal oxide contained in the target to pass therethrough; and causing the melted metal to flow into the lower crucible, so that the metal is separated from the metal oxide.

Herein, a metal oxide sintered body contained in a target does not necessarily include close connection between metal oxides. If a target is heated such that metal oxides in the target are not melted or decomposed, and that a metal in the target is melted to separate the metal from the metal oxides, the metal oxides are connected to each other to such an extent that does not lose the entire shape of the target. A metal oxide sintered body mentioned in the present specification also covers an idea of the metal oxide sintered body in such a case.

The size of the through hole is set such that it does not allow the target charged into the upper crucible to pass therethrough even after the target is caused to contract isotropically in its planar direction by 30%.

The planar direction is any direction parallel to the plane of the target.

If the volume fraction of the metal oxide with respect to the total volume of the target is 20% or more, it is considered that some connections are formed reliably between metal oxide particles in the target by sintering. Accordingly, the metal is recovered more reliably by the aforementioned method for recovering a metal.

It is preferable that the inner surface of a bottom portion of the upper crucible have a shape with a downward convex curve, as this shape allows the melted metal to flow easily through the through hole into the lower crucible.

The melted metal flowing into the lower crucible does not take up much space unlike a solid. Accordingly, the lower crucible may be smaller in internal volume than the upper crucible.

Contamination of oxygen in an atmosphere into the melted metal can be prevented if the heating of the target is performed in an inert atmosphere.

It is preferable that the heating of the target be performed by means of an electric resistance heater, as this reduces nonuniformity of temperature in a furnace to reduce the amount of metal left unmelted.

The metal oxide contained in the target includes at least one type or more types of metal oxides of, for example, Si, Al, Cr, Co, B, Ti, Zr, Ta, W, Mg, Y, Sn, Zn, and In.

When the target is used for magnetic recording media, the metal oxide contained in the target is a metal oxide including at least one type or more types of metal oxides of, for example, Si, Cr, Co, B, Ti, Zr, Ta, W, and Mg in many cases.

The metal contained in the target includes at least one type or more types of, for example, Pt, Au, Ag, Ru, Rh, Pd, Ir, W, Co, Cr, Fe, Ni, Ta, Cu, B, and Mo.

The "metal" used in the present invention may include metalloid such as Si and B.

Examples of the target for metal recovery include a used target, and a target left unused as a result of a problem found therein.

A first aspect of a method for manufacturing a target according to the present invention is a method including the step of obtaining a metal powder having a desirable composition by using a metal that is recovered from a target by applying the aforementioned method for recovering a metal.

The aforementioned step of obtaining a metal powder of a desirable composition is performed, for example, by heating and re-melting the recovered metal together with a metal the constituent of which is known.

A second aspect of the method for manufacturing a target according to the present invention is a method including the step of atomizing a metal in a melted state that is recovered from a target by applying the aforementioned method for recovering a metal to obtain the metal powder.

The aforementioned method for manufacturing a target may include the step of mixing the resultant metal powder and a predetermined metal oxide powder to obtain a powder mixture.

If the method includes the step of obtaining a powder mixture, the method may include the step of forming a sintered body of the resultant powder mixture.

The target manufactured by the method described above can be employed as a target for magnetic recording media depending on its composition.

Advantageous Effects of Invention

The method for recovering a metal from a target according to the present invention is a recovering method by heating the target for metal recovery under a condition of melting the contained metal without melting or decomposing the contained metal oxide, and the method includes: heating the target in an upper crucible of a two-level crucible that includes the upper crucible with a through hole formed in a bottom surface thereof, and a lower crucible disposed below the through hole, the size of the through hole being set such that it does not allow a sintered body of the metal oxide contained in the target to pass therethrough; and causing the melted metal to flow into the lower crucible, so that the metal is separated from the metal oxide. Accordingly, the metal can be separated from the metal oxide with a small number of process steps and less contamination of impurities.

The method for manufacturing a target according to the present invention manufactures a target by using a metal that is recovered from a target by applying the aforementioned method for recovering a metal. Accordingly, a target can be manufactured with a small number of process steps while a recycling efficiency of the metal is kept at a high level.

DESCRIPTION OF EMBODIMENTS

An embodiment of the present invention will now be described in detail below. A first step (separation step) described below relates to an exemplary embodiment of a method for recovering a metal from a target according to the invention. First to fourth steps described below relate to an exemplary embodiment of a method for manufacturing a target according to the present invention.

1. Separation Step

The method for recovering a metal from a target according to an embodiment of the present invention is a method for recovering the metal from a target that contains a metal and a metal oxide, and is characterized by heating the target under a condition of melting the metal without melting the metal oxide, so that the metal is separated from the metal oxide.

Herein, the metal contained in the target for metal recovery includes at least one or more of Pt, Au, Ag, Ru, Rh, Pd, Ir, W, Co, Cr, Fe, Ni, Ta, Cu, B, and Mo.

The metal oxide contained in the target for metal recovery includes at least one or more of metal oxides of Si, Al, Cr, Co, B, Ti, Zr, Ta, W, Mg, Y, Sn, Zn, and In. When the target is used for magnetic recording media, the metal oxide is a metal oxide including at least one or more of metal oxides of Si, Cr, Co, B, Ti, Zr, Ta, W, and Mg in many cases.

In the separation step, a target containing a metal and a metal oxide is divided into portions of appropriate sizes, and the divided portions are charged into the crucible. Then, the divided portions are heated in an inert atmosphere in an electric vacuum furnace by means of an electric resistance heater. The target is not necessarily heated by resistance heating, but may be heated by a different way of heating. Meanwhile, high-frequency heating has difficulty in heating a metal oxide through which electricity is hard to flow. Accordingly, in high-frequency heating, nonuniformity of temperature in a furnace becomes greater as a metal is melted and separated more from a metal oxide. In this case, there may be a large amount of the metal left unmelted. Accordingly, resistance heating is preferred. Further, heating in an inert atmosphere prevents contamination of oxygen into a resultant melted metal.

A heating temperature is set at temperatures required for melting of a metal constituent contained in a target or at higher temperatures than that, and is set to be lower than the melting-point and the decomposition temperature of a metal oxide. In the present embodiment, a metal contained in a target is melted into liquid form while a metal oxide in the target remains solid without being melted or decomposed. As a result, the metal and the metal oxide are efficiently separated from each other.

The material of the crucible can suitably be selected according to a temperature required for melting of a metal constituent contained in a target. Exemplary materials of the crucible include $MgO$, $Al_2O_3$, $CaO$ and $ZrO_2$, of which $MgO$ and $Al_2O_3$ are especially preferred.

Figure 1:
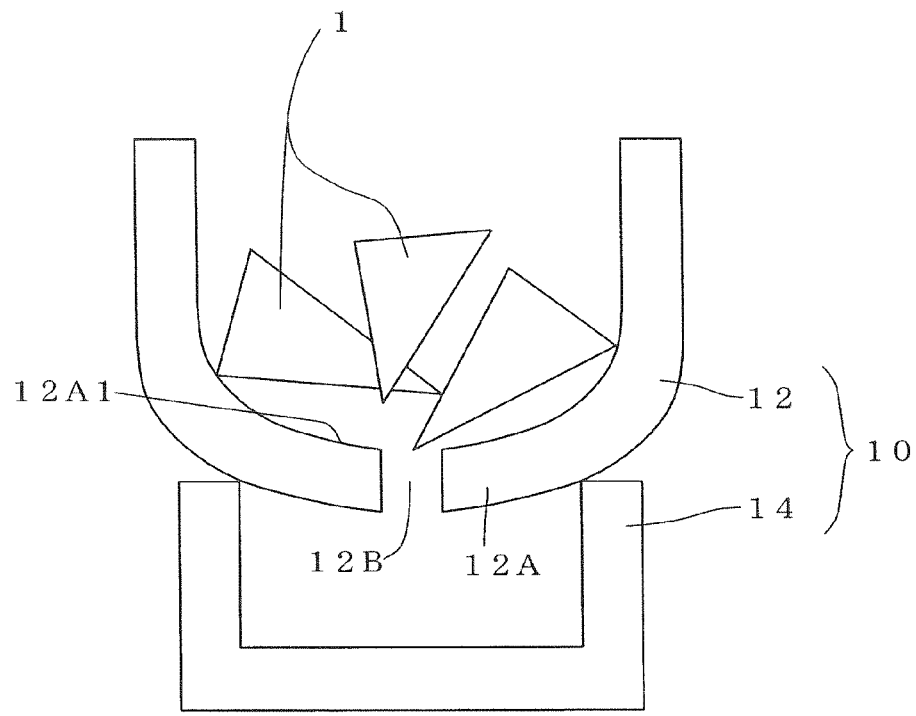
FIG. 1 is a cross sectional view schematically showing a two-level crucible 10 used in an embodiment.

In the present embodiment, a two-level crucible 10 with vertically arranged upper and lower crucibles 12 and 14 shown in FIG. 1 is used.

The upper crucible 12 has a through hole 12B with a diameter of, for example, about 5 mm formed in the center of a bottom portion 12A. The diameter of the through hole 12B formed in the center of the bottom portion 12A of the upper crucible 12 may suitably be determined according to the viscosity of a melted metal contained in a target, or the size of a metal oxide sintered body contained in the target. This diameter is set, for example, to 5 mm. The diameter of the through hole 12B may be increased, while a filter (mesh filter, for example) may be provided to the through hole 12B. In this case, the filter should have sufficient heat resistance to a temperature at which a target is heated.

Figure 2:
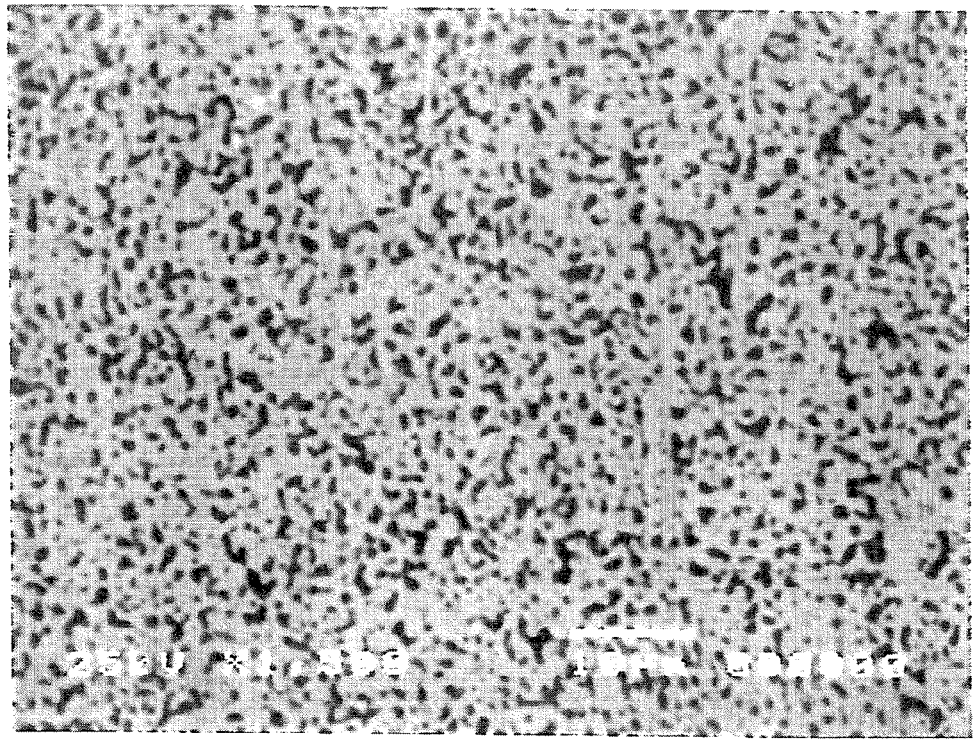
FIG. 2 is an electron micrograph showing the section of a target with a composition of 90(74Co-10Cr-16Pt)-10SiO$_2$.

FIG. 2 is an electron micrograph showing the section of a target with a composition of 90(74Co-10Cr-16Pt)-10$SiO_2$. In the electron micrograph, black dots show a metal oxide ($SiO_2$). The volume fraction of the metal oxide ($SiO_2$) with respect to the total volume of the target is 30.0%. As seen from FIG. 2, metal oxide particles do not disperse completely and do not exist independently of each other, but they are connected to each other in places by sintering. FIG. 2 is an electron micrograph taken at an arbitrary section of the target. Accordingly, from a three-dimensional point of view, it is considered that some connections are formed by sintering between the metal oxide particles in the target. It is also considered that the metal oxide particles in the target form a metal oxide sintered body as a result of heating during the formation of a target. This means that, even after the metals are extracted from the target as a result of heating, it is considered that the target after heating can maintain its shape similar to that before heating as a metal oxide sintered body. (As described later, after the metals are extracted from the target by heating, the target (metal oxide sintered body) has a shape defined by causing the target before heating to contract isotropically in its planar direction by about 5 to 30%.)

In order to form some connections between metal oxide particles in a target by sintering for forming a target to make a metal oxide sintered body from the metal oxide particles in the target, it is desirable that the volume fraction of the metal oxide with respect to the total volume of the target be 20% or more. Further, distances between oxide particles are small if the oxide particles in a target disperse uniformly and finely. In this case, the oxide particles are likely to be easily connected by sintering. Accordingly, a target that contains uniformly and finely dispersed oxide particles may be a more appropriate target from which a metal is to be recovered by the method of the present invention.

The diameter of the through hole 12B formed in the center of the bottom portion 12A of the upper crucible 12 is determined in consideration of the size of a target (the remaining metal oxide sintered body) from which a metal was extracted by heating (the target at this stage has a shape defined by causing the shape of the target before heating to contract isotropically in its planar direction by about 5 to 30%). More specifically, the diameter of the through hole 12B is determined such that it does not allow the target (the remaining metal oxide sintered body) from which the metal was extracted by heating to pass therethrough. Thus, after a target is heated in the upper crucible 12 under a condition of melting the metal in the target without melting or decomposing the metal oxide in the target, the metal oxide remains in the upper crucible 12, and the melted metal higher in specific gravity than the metal oxide is caused to flow into the lower crucible 14 through the through hole 12B. As a result, the metal in the target can be separated from the target.

Heating for melting a metal in a target and extracting the metal from the target further promotes to form connections between oxide particles in the target by sintering. This may strengthen the connections between the metal oxide particles, thereby allowing a metal oxide sintered body remaining in the upper crucible 12 to more easily maintain a shape defined by causing the target before heating to contract isotropically in its planar direction by about 5 to 30%.

After a target is heated and a metal is extracted from the target, a metal oxide sintered body remains in the upper crucible 12. As described in Examples given later, this metal oxide sintered body still contains the metal that is about 5% by mass of the total mass of the metal contained in the target before heating. This remaining metal is considered to function as a binder to connect metal oxides. Thus, it is likely that the metal oxide sintered body remaining in the upper crucible 12 can more easily maintain a shape defined by causing the target before heating to contract isotropically in its planar direction by about 5 to 30%.

The separation step will be described in more detail next. In the following description, a used target will be described as a target from which a metal is to be recovered. However, the following process is also applicable to a case where a metal is to be recovered from an unused target.

A used target 1 is divided into portions of appropriate sizes, and the divided portions are charged into the upper crucible 12 in which the divided portions are melted by heating. The melted metal higher in specific gravity than a metal oxide is caused to flow into the lower crucible 14 through the through hole 12B, and is then stored in the lower crucible 14. The heating temperature is set at a level that does not cause melting or decomposition of the metal oxide. As a result, the metal oxide remains solid without being melted or decomposed. And the metal oxide in the used target 1 forms a sintered body during the formation of the target as already described. Furthermore, the diameter of the through hole 12B is set such that it does not allow the metal oxide sintered body to pass therethrough. Accordingly, the metal oxide in the used target 1 does not drop through the through hole 12B. This reduces contamination of the metal oxide into the metal to be collected in the lower crucible 14.

It is preferable that the inner surface 12A1 of the bottom portion 12A of the upper crucible 12 have a shape with a downward convex curved surface as shown in FIG. 1. This shape allows the melted metal to easily drop through the through hole 12B. This shape also prevents the used target 1 charged into the upper crucible 12 from completely blocking the through hole 12B.

The used target 1 is charged into the upper crucible 12. Accordingly, it is preferable that the upper crucible 12 be greater in size (in diameter and in height) than the lower crucible 14. The lower crucible 14 has a required internal volume such that it can receive a melted metal flowing from the used target 1. In this regard, as a liquid does not take up much space unlike a solid, the internal volume of the lower crucible 14 can be made small.

An electric vacuum furnace is maintained at a predetermined heating temperature during a period of time necessary for the metal contained in the used target 1 to be melted, and for the melted metal to flow into the lower crucible 14. After the elapse of this period of time, heating is finished, and the melted metal stored in the lower crucible 14 is furnace-cooled in the electric vacuum furnace. Then, the metal is solidified in the lower crucible 14 to become an ingot.

It should be noted that the object of the present invention is to recover a metal from a target that contains a metal and a metal oxide. However, it is considered that a metal can be recovered from a target that contains a metal compound other than metal oxides by applying the present invention thereto.

2. Metal Powder Production Step

The resultant ingot is subjected to re-melting and atomization to produce a metal powder. In this step, composition analysis of the resultant ingot is performed first. The ingot is divided into portions of appropriate sizes. Then, based on the result of the composition analysis, the divided portions of the ingot are melted by heating together with a metal the constituent of which is known, thereby forming a liquid metal with a desirable composition.

The resultant liquid metal is used to perform atomization to produce a metal powder. Atomization of any type is applicable in the present embodiment. By way of example, any of gas atomization, water atomization, and centrifugal atomization may be applied.

If gas atomization is employed, an oxygen concentration in the metal powder to be produced can be controlled to a lower level if an argon gas or a nitrogen gas is used.

3. Powder Mixture Production Step

According to the composition of a target to be recycled, the metal powder, the metal oxide powder and the like the constituent of which is known are mixed into the metal powder obtained as a result of atomization, thereby producing a powder mixture. This mixing is performed with a ball mill, for example.

4. Sintered Body Formation Step

The powder mixture is subjected to sintering to form a sintered body. The sintered body may be formed by any method such as hot press, hot isostatic press (HIP), and spark plasma sintering (SPS).

The outer circumference, and front and back surfaces of the resultant sintered body are ground by about 1 mm, so that a recycled target is obtained.

5. Modifications

In the embodiment described above, a melted metal obtained in the separation step is solidified by cooling to form an ingot. Next, the ingot is melted again by heating together with a metal the constituent of which is known, thereby forming a liquid metal with a desirable composition. Then, atomization is performed by using the liquid metal to produce a metal powder. The structure of an atomizing device may also be configured such that it can atomize the melted metal obtained in the separation step as is.

The atomizing device of this structure eliminates the need for obtaining an ingot in the separation step, and the need for re-melting the ingot.

If the melted metal obtained in the separation step is subjected to atomization as is, the constituent of the obtained metal powder as a result of the atomization is not controlled. Accordingly, in this case, the following process should be followed to form a recycled target. In this process, composition of the resultant metal powder is analyzed. Then, the resultant metal powder is mixed with a metal powder or a metal oxide powder the constituent of which is known to obtain a powder mixture with a desirable composition. The resultant powder mixture is subjected to sintering, thereby forming a recycled target.

tion, and was determined as 15 ppm by mass. This means that contamination of the metal oxide ($SiO_2$) into the resultant ingot was limited to a considerably low level.

Table 1 shows the result of ICP analysis of the resultant ingot. The result of the ICP analysis shown in Table 1 is averages of three measurements made at upper, middle, and lower portions of the resultant ingot. Based on the analysis result, the resultant ingot was melted by heating together with elemental substances of Co, Cr, and Pt at respective given amounts to produce a liquid metal with a composition of 70 at. % Co, 10 at. % Cr, and 20 at. % Pt. Then, a metal powder was formed by gas atomization.

TABLE 1

|  | Co (%) | Cr (%) | Pt (%) | Si (ppm) | Ni (ppm) | Fe (ppm) | Al (ppm) | Cu (ppm) |
| --- | --- | --- | --- | --- | --- | --- | --- | --- |
| MASS RATIO | 48.48 | 6.02 | 45.50 | 360 | 33 | 69 | <10 | <10 |
| ATOMIC RATIO | 70.20 | 9.89 | 19.91 | — | — | — | — | — |

EXAMPLES

Example 1

A used target with a composition of 92(70Co-10Cr-20Pt)-8$SiO_2$ for a magnetic recording medium, containing metals and a metal oxide, was employed as a target of metal recovery, and a recycled target was manufactured. The metals and the metal oxide contained in the used target were Co, Cr and Pt, and $SiO_2$. The volume fraction of the metal oxide ($SiO_2$) with respect to the total volume of the target was 24.9 vol. %.

Figure 3:
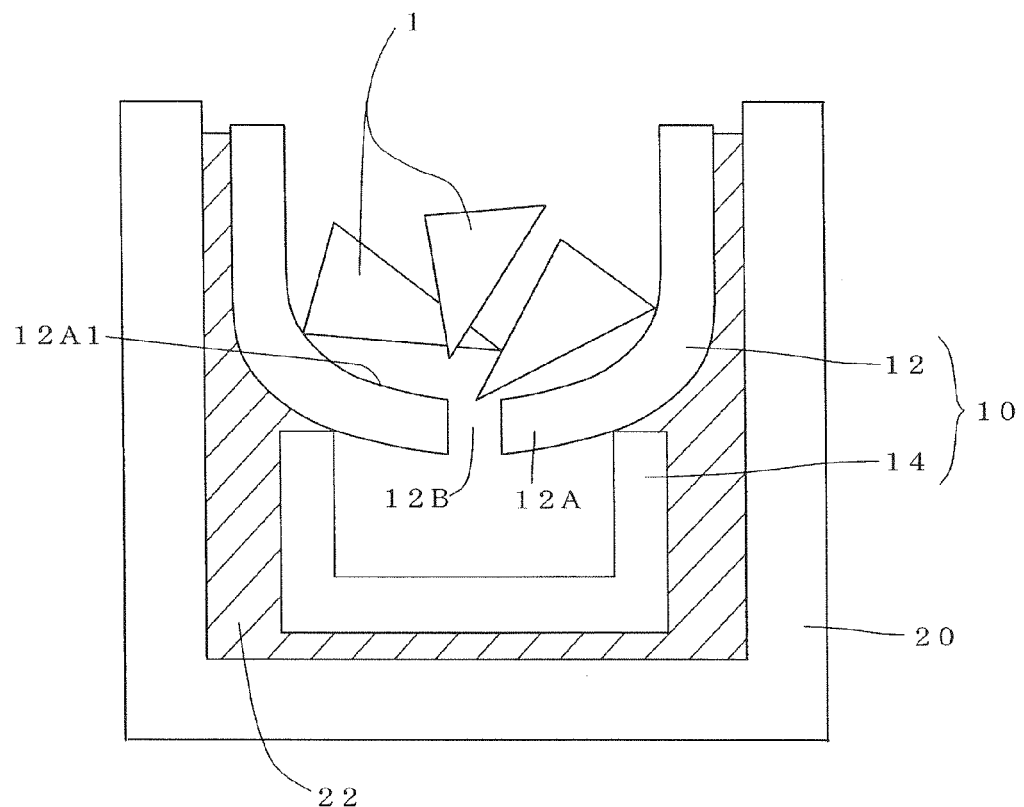
FIG. 3 is a cross sectional view schematically showing how a two-level crucible was used in Example 1.

A crucible used for melting the metals by heating has the same shape as that of the two-level crucible 10 shown in FIG. 1. In addition, in order to heat the used target at a high temperature of 1650° C. for melting, MgO was selected as a material for the two-level crucible 10. Also, in order to prevent an adverse effect on a heating device to be exerted by possible breakage of the two-level crucible 10, the two-level crucible 10 was disposed in an outer crucible 20 made of $Al_2O_3$, and a space between the two-level crucible 10 and the outer crucible 20 was filled with a $ZrO_2$ powder 22 as shown in FIG. 3. The diameter of the through hole 123 formed in the upper crucible 12 was set at 5 mm.

Five used targets were divided into portions of sizes of from about 5 cm×5 cm to about 10 cm×10 cm, and the divided portions were charged into the upper crucible 12 of the two-level crucible 10. The total mass of the charged targets was 5356.12 g. After being charged into the upper crucible 12, the targets were heated up to a temperature of 1650° C. at a rate of temperature rise of 10° C./min in an argon gas atmosphere by using an electric vacuum furnace that performs heating with an electric resistance heater. Then, the targets were held in this temperature for three hours. Next, the two-level crucible 10 was furnace-cooled, and an ingot was obtained in the lower crucible 14. The resultant ingot was in the form of a circular plate with a diameter of about 10 cm, a thickness of about 7 cm, and a mass of 4180.18 g. The total mass of the targets charged into the upper crucible 12 was 5356.12 g, and the total mass of the metals contained in the used targets can be calculated from the composition, which is 4841.93 g. Accordingly, the recovery rate of the metals recovered from the charged targets was 86.33%.

Figure 4:
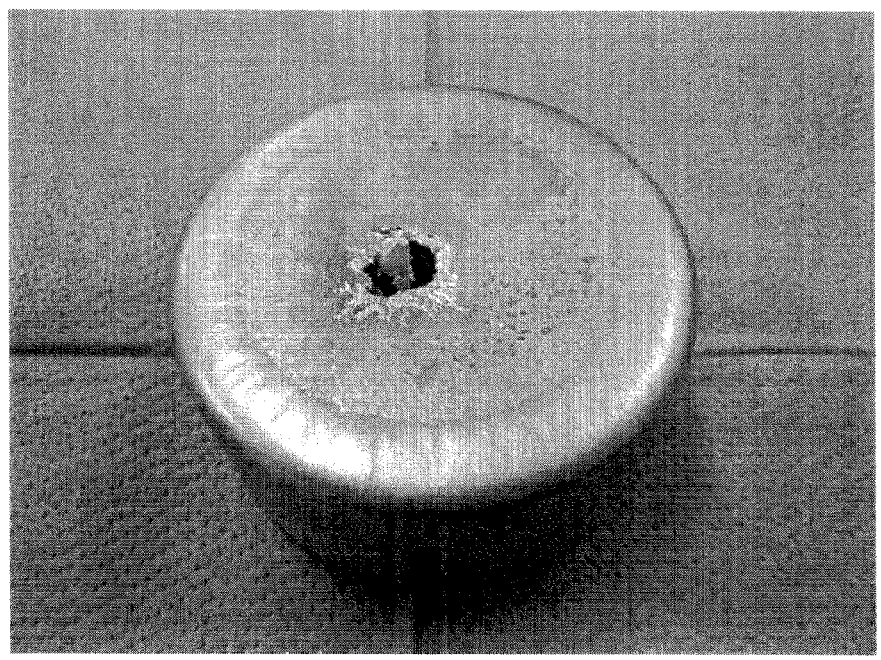
FIG. 4 is a photograph showing the appearance of an ingot obtained in Example 1.

FIG. 4 is a photograph showing the appearance of the resultant ingot. The ingot had metallic luster on its surface. The amount of oxygen in the resultant ingot was measured by the O—N analyzer (TC600) available from LECO Corpora- An $SiO_2$ powder was added to the resultant metal powder such that the composition of 92(70Co-10Cr-20Pt)-8$SiO_2$ could be obtained. Then, the $SiO_2$ powder and the metal powder were mixed with a ball mill, so that a powder mixture was produced.

The resultant powder mixture was hot pressed to form a sintered body. Next, the outer circumference, and front and back surfaces of the resultant sintered body were ground by about 1 mm. As a result, a recycled target was produced. Sputtering was performed by using the recycled target to deposit a film. Then, it was found that the resultant film is substantially the same as a film obtained by using a target formed only of a virgin material without recycling a used target. As a result, it was confirmed that, like a target produced only of a virgin material, the recycled target is applicable as a target for a magnetic recording medium.

Figure 5:
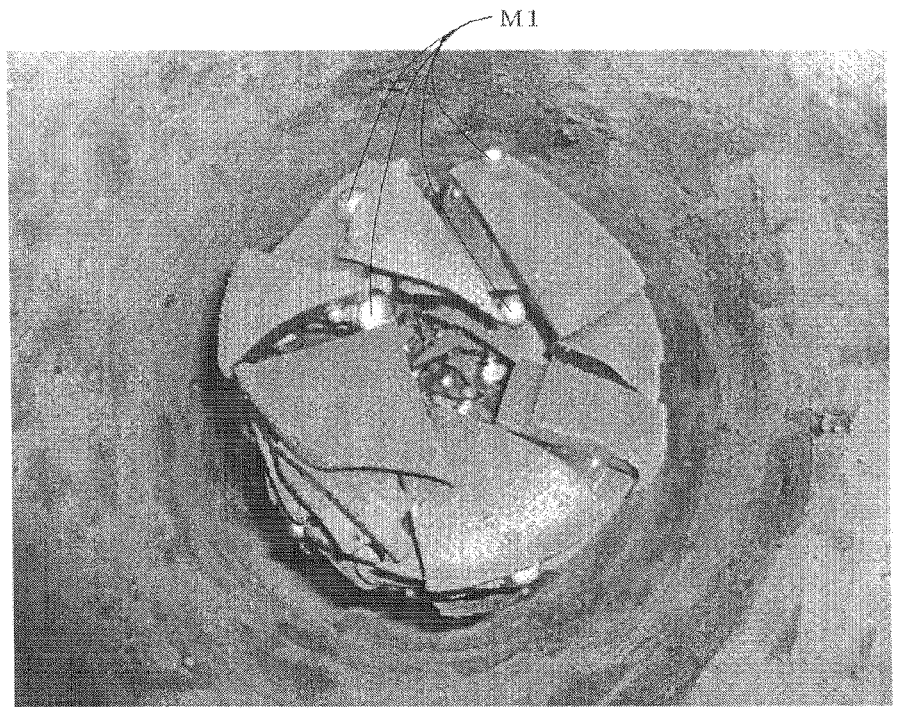
FIG. 5 is a photograph showing the appearance of used targets in an upper crucible after being subjected to heating in Example 1.

It should be noted that FIG. 5 is a photograph showing the appearance of the used targets in the upper crucible 12 after being held at a temperature of 1650° C. for three hours in the vacuum melting furnace. The used targets charged into the upper crucible 12 maintained their shapes even after heating, and the shapes are similar to those before heating (shapes defined by causing the targets before heating to contract isotropically in their planar directions by about 5 to 30%). As already described, it is considered that some connections are formed between metal oxide particles in the used targets (which is $SiO_2$ in Example 1) to form a metal oxide sintered body as a result of heat sintering during formation of a target. This may be the reason why the used targets charged into the upper crucible 12 could maintain their aforementioned similar shapes even after the metals in the targets were melted and then flowed from the targets into the lower crucible 14.

As seen from the photograph of FIG. 5 showing the appearance thereof, spherical metals M1 exuded and solidified on target surfaces are generated in the upper crucible 12. These spherical metals M1 do not contain a metal oxide. Further, a membranous metal is generated on a surface of the bottom portion of a residual (oxide). This membranous metal does not contain a metal oxide either. (Although Example 1 does not refer to a photograph of the appearance of such a membranous metal, the membranous metal formed in Example 1 had a shape similar to those of membranous metals shown in the photographs in FIGS. 11 and 12 referred to in Example 2.) The sum of the mass of the metals collected in the lower crucible 14, and the masses of the spherical metals M1 and the membranous metal in the upper crucible 12 was found to be about 95% of the total mass of the metals contained in the used targets charged into the upper crucible 12. This means that about 5% of the total mass of the metals contained in the used targets remains in the used target 1 from which the melted metals flowed. The remaining metals are considered to function as a binder to maintain the shape of metal oxide sintered bodies in the used targets.

Comparative Example 1

Figure 6:
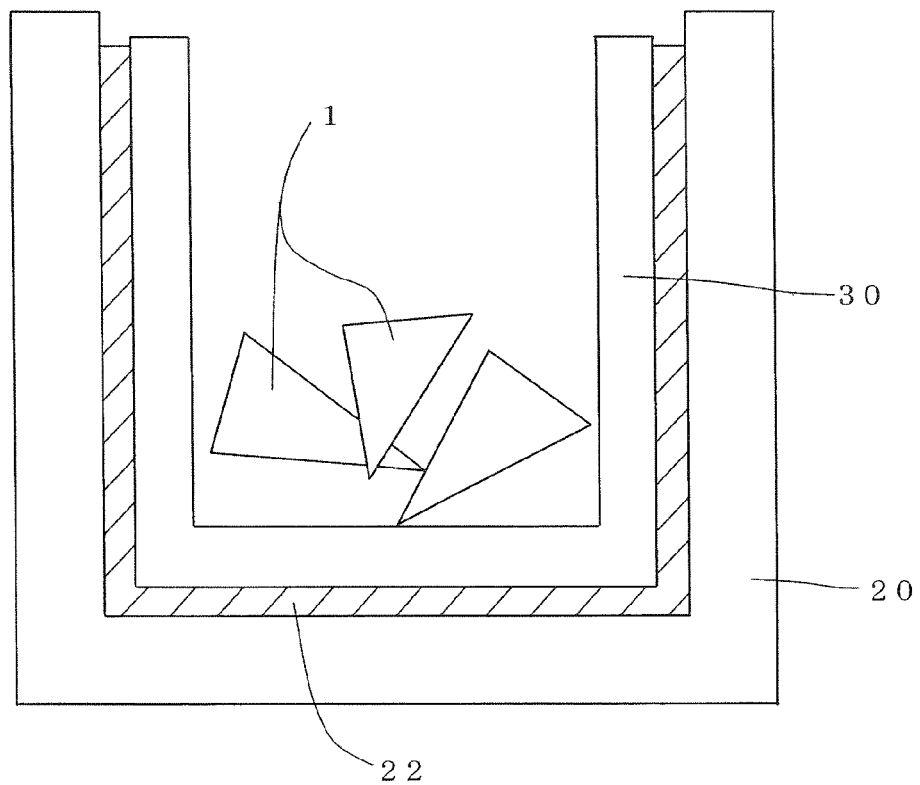
FIG. 6 is a cross sectional view schematically showing how a single-level crucible was used in Comparative Example 1.

While Example 1 employed the two-level crucible 10, Comparative Example 1 employed a single-level crucible 30 generally employed shown in FIG. 6. Except for this difference, a used target with a composition of 92(70Co-10Cr-20Pt)-8SiO$_2$, containing metals and metal oxide, was melted by heating in the same method as that in Example 1 to obtain an ingot.

Figure 7:
FIG. 7 is a photograph showing the appearance of an ingot obtained in Comparative Example 1.

FIG. 7 is a photograph showing the appearance of the resultant ingot. The ingot had no metallic luster, and an agglomerated metal oxide were distributed over a wide range mainly on a surface layer portion on the upper portion of the ingot. In this case, the metals could not be separated well from the metal oxide.

Example 2

A used target with a composition of 91.7(74.5Co-9.5Cr-16Pt)-8.3SiO$_2$ for a magnetic recording medium, containing metals and a metal oxide, was employed, and the metals were recovered from the target. The metals and the metal oxide in the used target 2 were Co, Cr and Pt, and SiO$_2$. The volume fraction of the metal oxide (SiO$_2$) with respect to the total volume of the target was 25.9 vol. %. In Example 2, the shapes of the target before and after heating were measured, and the condition of contraction of the target caused by heating was quantitatively evaluated.

Figure 8:
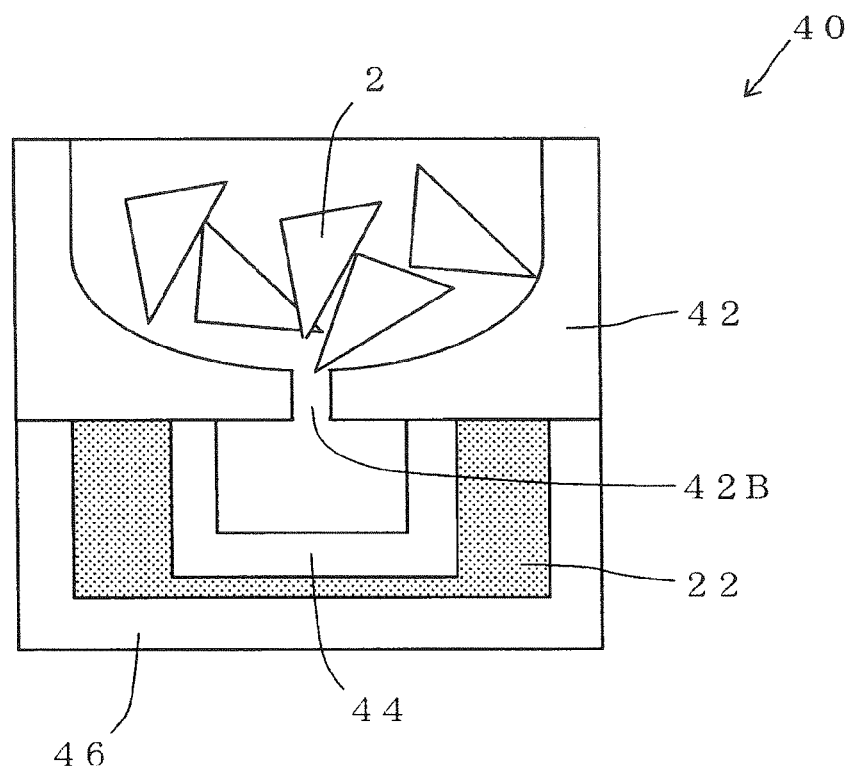
FIG. 8 is a cross sectional view schematically showing how a two-level crucible was used in Example 2.

A two-level crucible 40 shown in FIG. 8 was used for melting the metals by heating. An upper crucible 42, a lower crucible 44, and an outer crucible 46 are all made of MgO. Further, a space between the lower and outer crucibles 44 and 46 was filled with a ZrO$_2$ powder 22.

The outer and inner diameters, and the height of the upper crucible 42 are 170 mm, 145 mm, and 135 mm, respectively. The inner surface of a bottom portion 42A has a shape with a downward convex curved surface. A through hole 428 with a diameter of 5 mm is formed in the center of the bottom portion 42A. The bottom portion 42A has a thickness of 25 mm around the through hole 423. The upper crucible 42 includes a cylindrical body defined between the upper end surface and a level below the upper end surface by 80 mm, and the bottom portion 42A. The bottom portion 42A is defined under the cylindrical body, and the inner surface of which has a shape with a downward convex curved surface. The aforementioned outer and inner diameters were values measured at the upper end surface.

The outer and inner diameters, and the height of the lower crucible 44 are 124 mm, 100 mm, and 110 mm, respectively. The lower crucible 44 was disposed in the outer crucible 46, and a space between the lower and outer crucibles 44 and 46 was filled with a ZrO$_2$ powder 22. The outer and inner diameters, and the height of the outer crucible 46 are 170 mm, 145 mm, and 135 mm, respectively.

Four used targets with a composition of 91.7(74.5Co-9.5Cr-16Pt)-8.3SiO$_2$ were divided into portions of sizes of from about 5 cm×5 cm to about 10 cm×10 cm, and the divided portions were charged into the upper crucible 42. The total mass of the targets 2 charged was 4986.34 g. A divided portion of the used target 2 placed at the top, which is one of the divided portions of the used targets 2 charged into the upper crucible 42, was a circular sector of a radius of 80 mm and a thickness of 5.6 mm.

After the used targets 2 were charged into the upper crucible 42, the two-level crucible 40 was disposed in an electric vacuum furnace. Then, the used targets 2 were heated in an argon gas atmosphere. The used targets 2 were heated up to a temperature of 1650° C. at a rate of temperature rise of 10° C./min, and were held at this temperature for one hour.

Figure 9A:
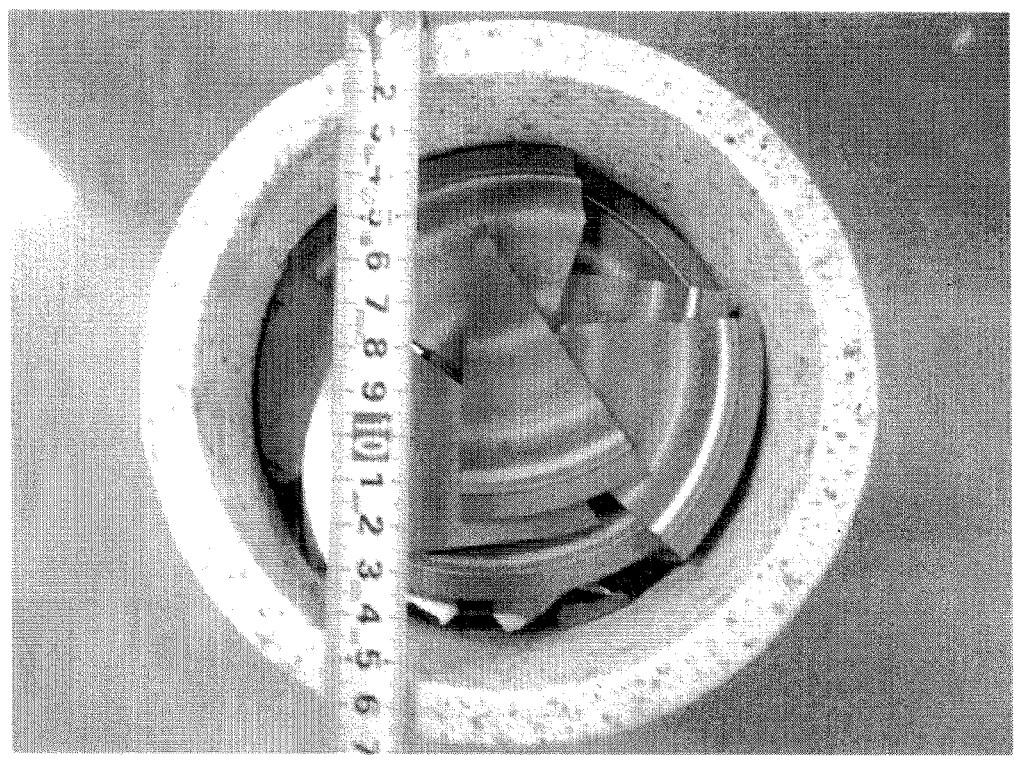
FIG. 9A is a photograph showing the appearances of used targets in an upper crucible in a state before heating.
Figure 9B:
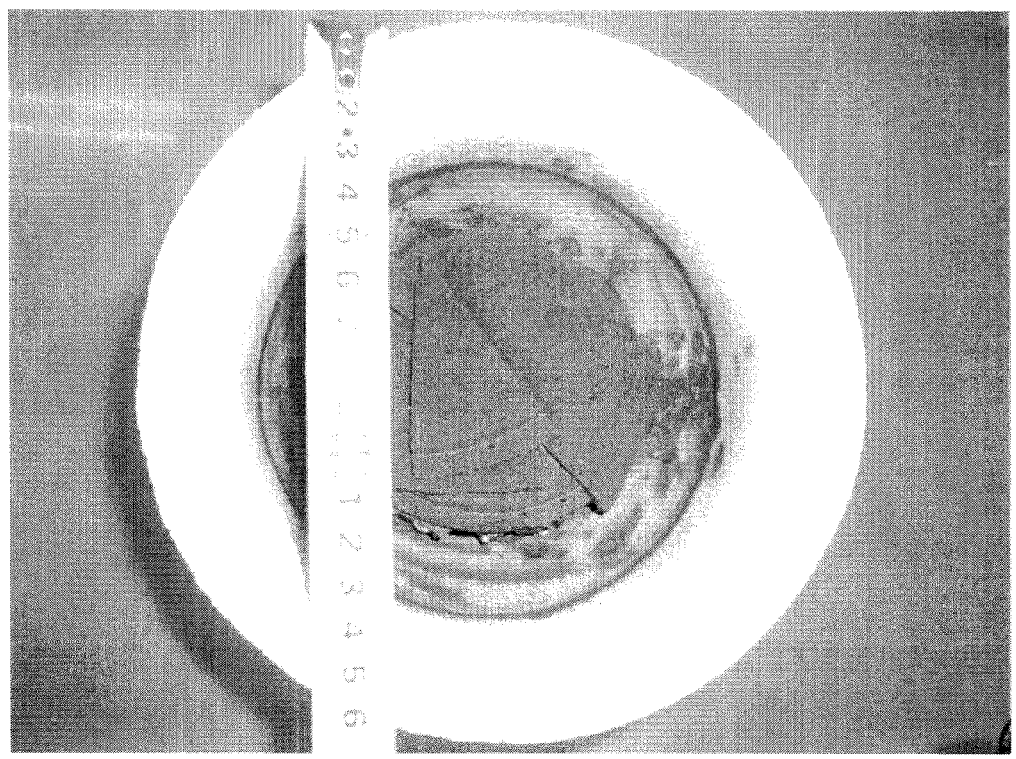
FIG. 9B is a photograph showing the appearances of used targets in an upper crucible in a state after heating (after metal recovery)

FIGS. 9A and 9B are photographs showing the appearances of the used targets in the upper crucible 42 in a state before heating, and in a state after heating. FIG. 9A is a photograph showing the appearances of the used targets in the upper crucible 42 in a state before heating, and FIG. 9B is a photograph showing the appearances of the used targets in the upper crucible 42 in a state after heating (after metal recovery). As seen from FIGS. 9A and 9B, while the used targets 2 charged into the upper crucible 42 contracted, the used targets 2 maintained their shapes after heating that are the same as (similar to) those before heating.

As already described, the divided portion of the used target 2 placed at the top, which is one of the divided portions of the used targets charged into the upper crucible 42, was a circular sector of a radius of 80 mm and a thickness of 5.6 mm. In contrast, this divided portion placed at the top after heating (after metal recovery) had a shape of a circular sector with a radius of 75 mm and a thickness of 4.9 mm.

A coefficient of contraction of the used targets 2 caused as a result of heating was calculated on the basis of the aforementioned measured values of the shape. The calculated coefficients of contraction of the circular sector were 6.3% in a radius direction and 12.5% in a thickness direction, and a coefficient of volume contraction was about 23%. As seen from the photographs in FIGS. 9A and 9B showing the appearances of the used targets in the upper crucible 42 in the states before and after heating, respectively, the used targets 2 after being subjected to heating maintained their shapes that are the same as (similar to) those before heating. This means that the used targets 2 contracted isotropically in their planar directions. The coefficient of contraction of the circular sector in a radius direction is 6.3%. Accordingly, it may be concluded that, in Example 2, the used targets 2 contracted isotropically in their planar directions by 6.3% as a result of heating.

A ruler is shown in each of the photographs of FIGS. 9A and 95. In FIGS. 9A and 95, the radius of the divided portion of the used target 2 placed at the top seems to be smaller than the aforementioned radii (80 mm before heating and 75 mm after heating) according to the value read from the ruler. The reason therefor is that the ruler and the divided portion of the used target placed at the top are at different heights. The aforementioned radii (80 mm before heating and 75 mm after heating) were obtained by placing the ruler along the divided portion of the used target placed at the top, and are correct radii accordingly.

Figure 10:
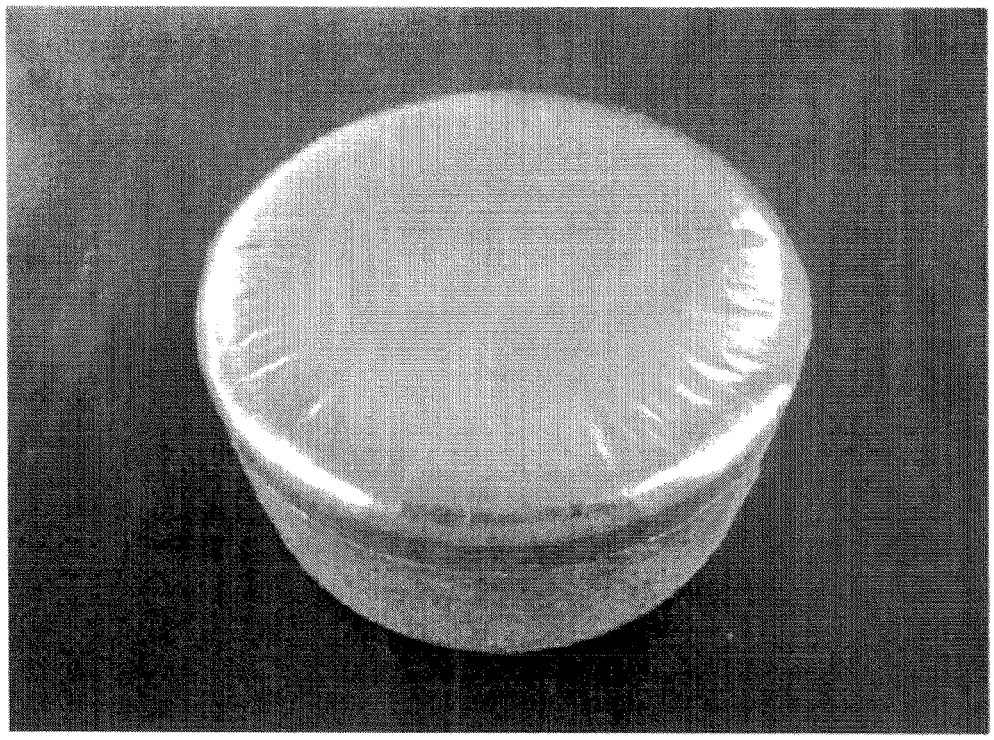
FIG. 10 is a photograph showing the appearance of an ingot obtained in Example 2.

FIG. 10 is a photograph showing the appearance of the metals collected in the lower crucible 44. As seen from FIG. 10, there are no portion observed that has no metallic luster, by which it is considered that the metals collected in the lower crucible 44 contain substantially no oxide.

The mass of the metals collected in the lower crucible 44 was 4005.25 g. The total mass of the targets 2 charged into the upper crucible 42 was 4986.34 g, and the total mass of the metals contained in the used targets 2 calculated from the composition was 4669.21 g. Accordingly, the recovery rate of the metals collected in the lower crucible 44 was 85.78%.

Figure 11:
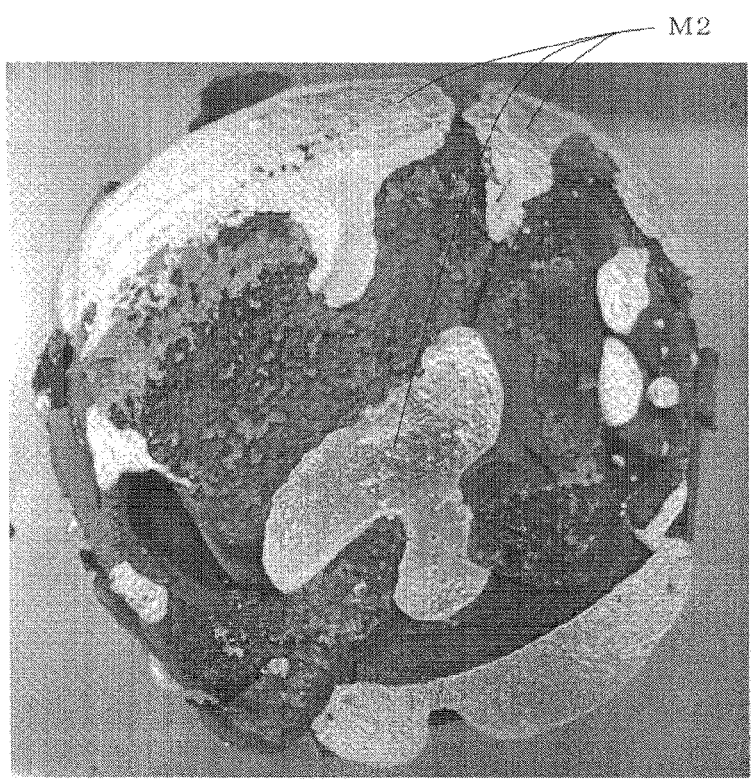
FIG. 11 is a photograph showing the appearance of a bottom portion of a residual (oxide) left in an upper crucible after heating in Example 2.
Figure 12:
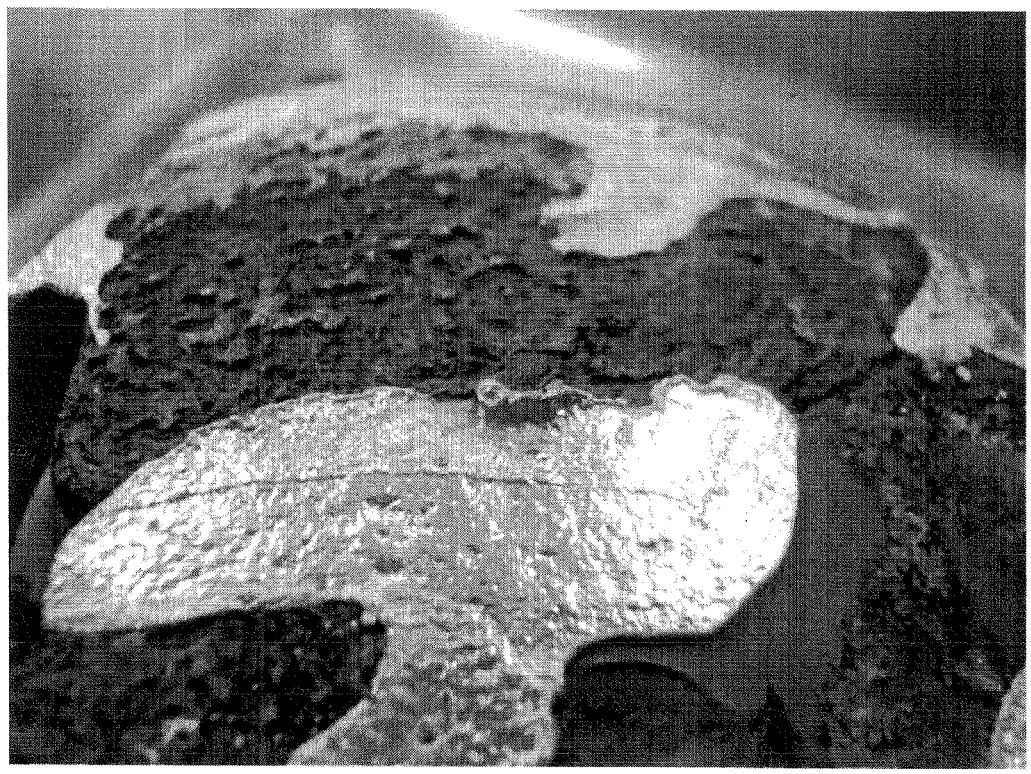
FIG. 12 is a photograph showing the enlarged appearance of a part corresponding to a through hole in the upper crucible shown in FIG. 11, and a region around the part corresponding to the through hole.

FIG. 11 is a photograph showing the appearance of the bottom portion of a residual (oxide) left in the upper crucible 42 after heating. FIG. 12 is a photograph showing the enlarged appearance of a part corresponding to the through hole 42B in the upper crucible 42, and a region around the part corresponding to the through hole 42B. In FIG. 12, a projection in the central portion of the photograph corresponds to the through hole 42B in the upper crucible 42. The projection is made of a metal.

Membranous metals M2 are also observed on a surface of the bottom portion of the residual (oxide) as shown in FIGS. 11 and 12. However, only those metals attached to the surface of the agglomerated oxide (residual) were recognized by visual inspection. It is considered accordingly that the metals flowed sufficiently from the used targets 2.

The agglomerated oxide left in the upper crucible 42 can be broken by application of some force with a finger. The agglomerated oxide left in the upper crucible 42 is in the form of a sponge with a lot of pores therein. The agglomerated oxide is still in the shape of a sponge even after the metals flowed out by heating. This may mean that the agglomerated oxide can maintain its shape even after the metals flowed out by heating. This may also mean that connections are formed between the oxide particles.

Example 3

A used target with a composition of 92(70Co-14Cr-16Pt)-5$SiO_2$-3$Cr_2O_3$ for a magnetic recording medium, containing metals and metal oxides, was employed, and the metals were recovered from the target. The metals and the metal oxides in the used target were Co, Cr and Pt, and $SiO_2$ and $Cr_2O_3$. The volume fraction of the metal oxides ($SiO_2$+$Cr_2O_3$) with respect to the total volume of the target was 25.6 vol. %.

A crucible used for melting the metals by heating was the same as the two-level crucible 40 used in Example 2 (see FIG. 8).

The aforementioned used targets amounting to five in number were divided into portions of sizes of from about 5 cm×5 cm to about 10 cm×10 cm, and the divided portions were charged into the upper crucible 42 of the two-level crucible 40. The total mass of the charged targets was 5330.61 g. After being charged into the upper crucible 42, the targets were heated up to a temperature of 1650° C. at a rate of temperature rise of 10° C./min in a vacuum melting furnace, and were then held at this temperature for one hour.

Next, the two-level crucible 40 was furnace-cooled, and an ingot was obtained in the lower crucible 44. The resultant ingot was in the form of a circular plate with a diameter of about 10 cm, a thickness of about 5 cm, and a mass of 4314.19 g. The total mass of the used targets charged into the upper crucible 42 was 5330.61 g, and the total mass of the metals contained in the used targets calculated from the composition was 4832.20 g. Accordingly, the recovery rate of the metals recovered from the charged targets was 89.28%. The ingot had metallic luster on its surface.

Figure 13A:
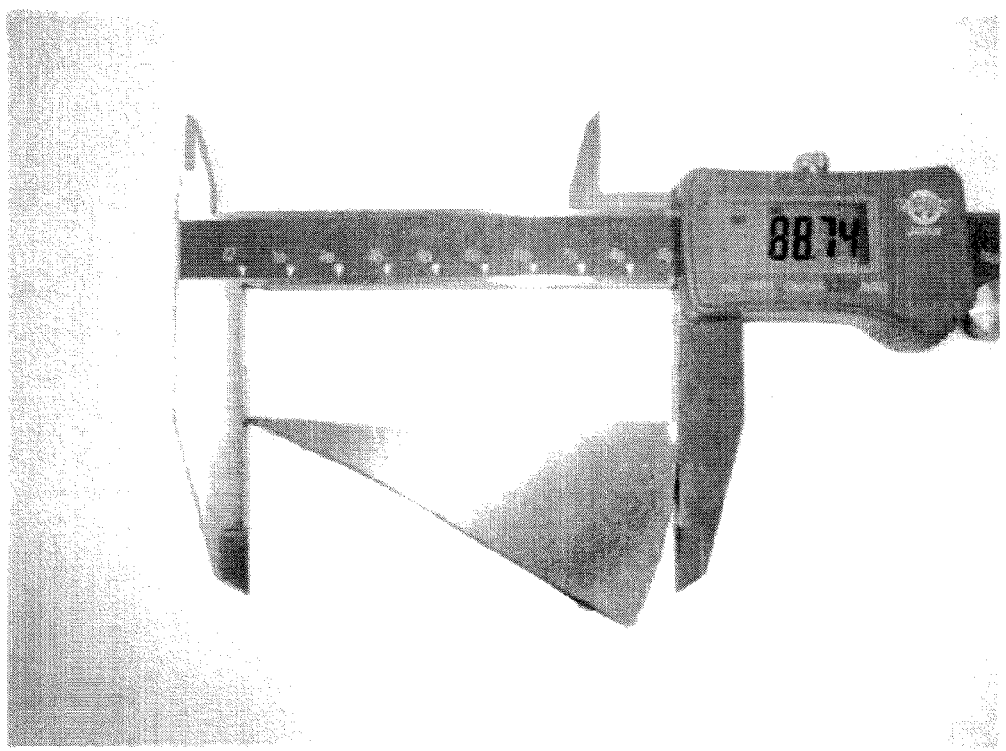
FIG. 13A is a photograph showing how the dimensions in a radius direction before heating of a divided portion of a used target which is placed at the uppermost stage in Example 3 was measured.
Figure 13B:
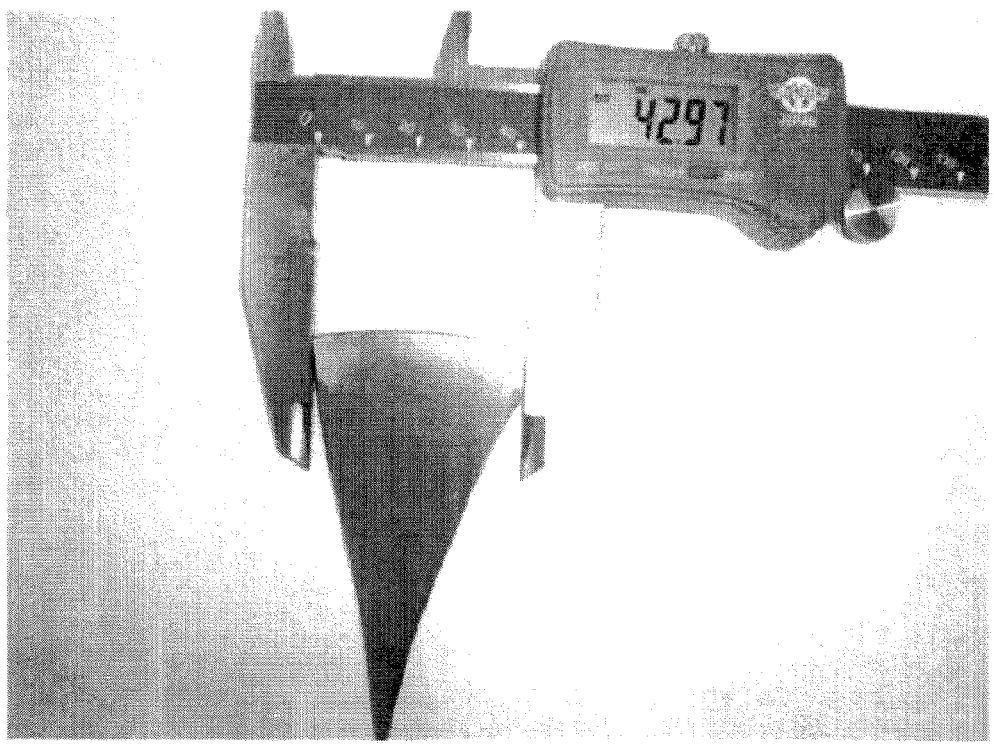
FIG. 13B is a photograph showing how the dimensions in a circumferential direction before heating of the divided portion of a used target which is placed at the uppermost stage in Example 3 was measured.
Figure 13C:
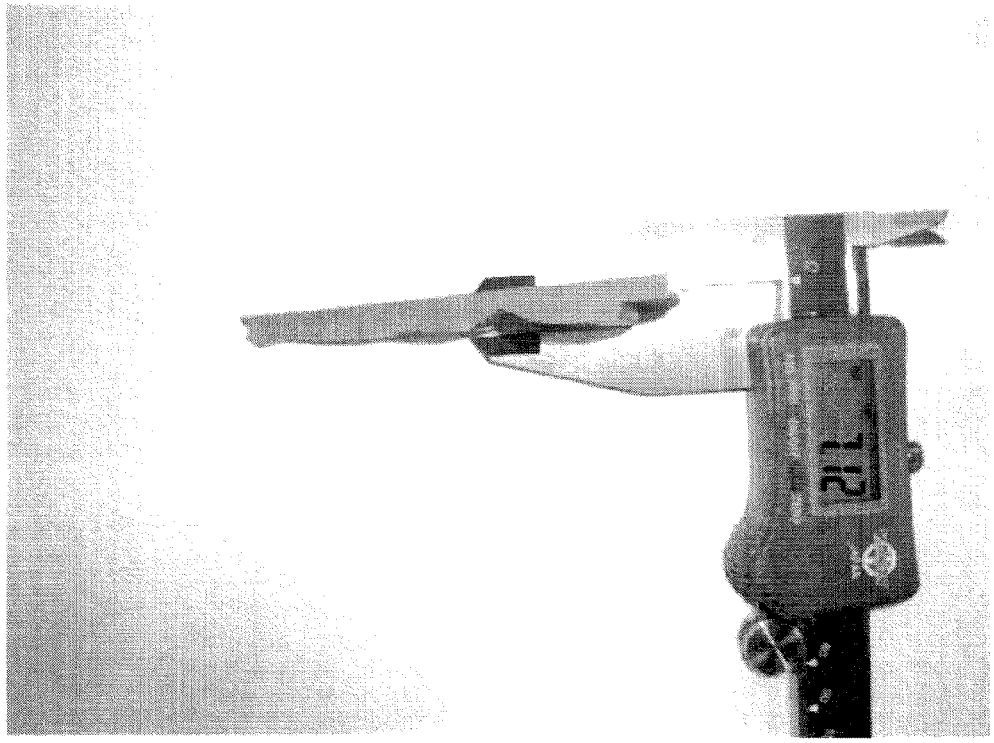
FIG. 13C is a photograph showing how the dimensions in a thickness direction before heating of the divided portion of a used target which is placed at the uppermost stage in Example 3 was measured.

FIGS. 13A to 13C are photographs each showing how the geometry before heating of a divided portion of the used target placed at the top, which is one of the divided portions of the used targets charged into the upper crucible 42, was measured with a digital vernier caliper. Specifically, FIGS. 13A, 13B and 13C show how the dimensions in a radius direction, in a circumferential direction, and in a thickness direction were measured, respectively. The dimensions before heating were 88.74 mm in a radius direction, 42.97 mm in a circumferential direction, and 7.12 mm in a thickness direction.

Figure 14A:
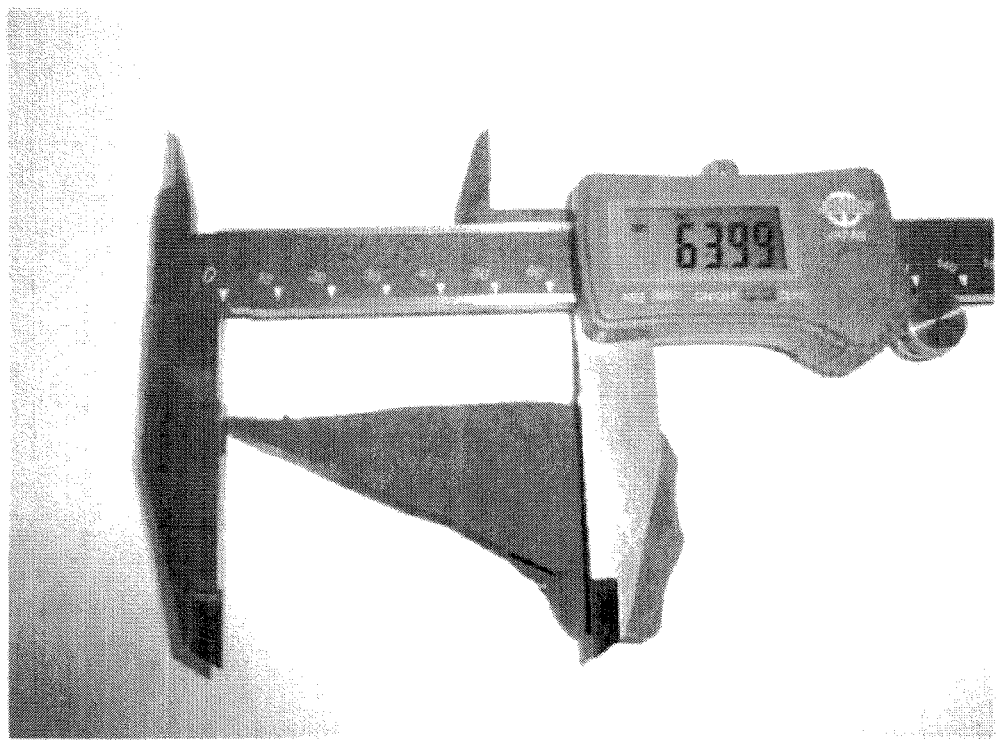
FIG. 14A is a photograph showing how the dimensions in a radius direction after heating of a divided portion of a used target which is placed at the uppermost stage in Example 3 was measured.
Figure 14B:
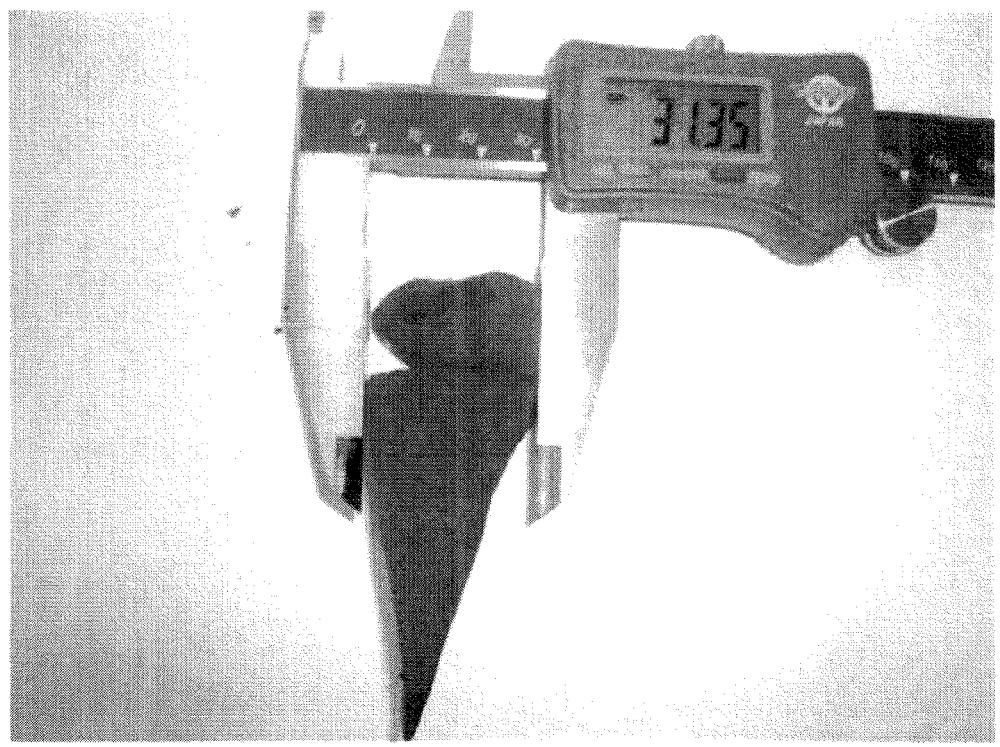
FIG. 14B is a photograph showing how the dimensions in a circumferential direction after heating of the divided portion of a used target which is placed at the uppermost stage in Example 3 was measured.
Figure 14C:
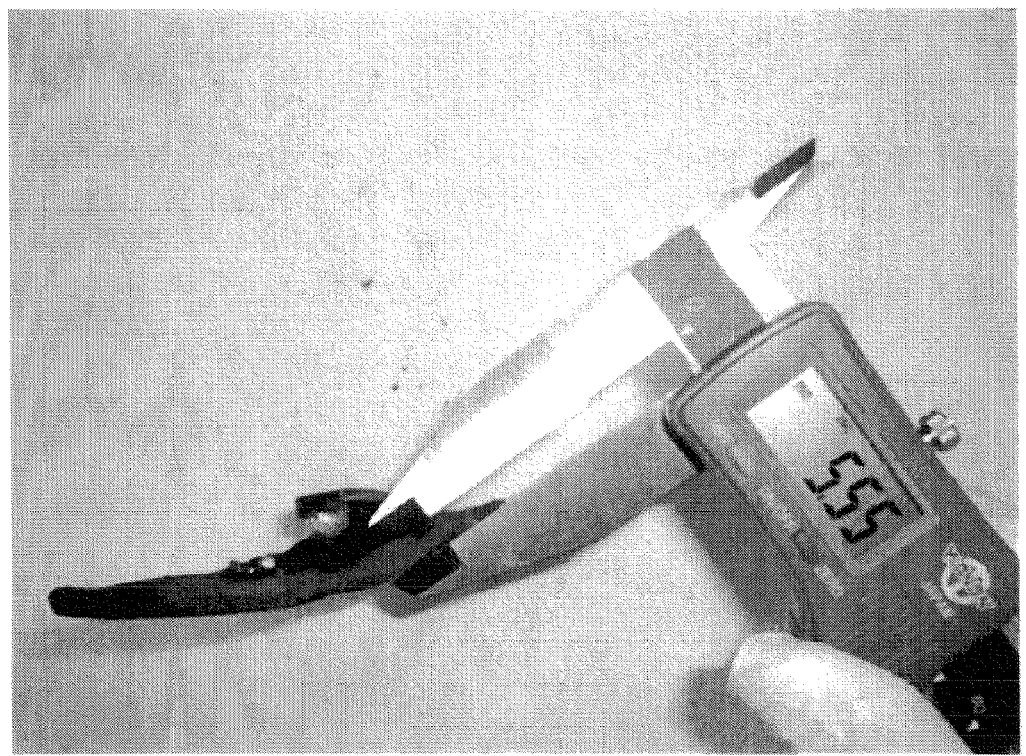
FIG. 14C is a photograph showing how the dimensions in a thickness direction after heating of the divided portion of a used target which is placed at the uppermost stage in Example 3 was measured.

FIGS. 14A to 14C are photographs each showing how the geometry after heating of the divided portion of the used target placed at the top, which is one of the divided portions of the used targets charged into the upper crucible 42, was measured with a digital vernier caliper. FIGS. 14A, 14B and 14C show how the dimensions in a radius direction, in a circumferential direction, and in a thickness direction were measured, respectively. The dimensions after heating were 63.99 mm in a radius direction, 31.35 mm in a circumferential direction, and 5.55 mm in a thickness direction.

Thus, the coefficients of contraction of the used targets caused by heating were 27.89% in a radius direction, 27.04% in a circumferential direction, and 22.05% in a thickness direction.

A sum of the masses of the metals collected in the lower crucible 44, and spherical and membranous metals exuded and solidified on target surfaces in the upper crucible 42 was about 97% of the total mass of the metals contained in the used targets charged into the upper crucible 42. This means that about 3% of the total mass of the metals contained in the used targets remains in the used targets from which the melted metals flowed. The remaining metals are considered to function as a binder to maintain the shapes of oxide sintered bodies in the used targets.

Table 2 shows the result of composition analysis of the resultant ingot, made by ICP. The result of the composition analysis shown in Table 2 was obtained as a result of one measurement made at a middle portion of the ingot. In Example 1, measurements were made at upper, middle, and lower portions of the resultant ingot, and averages of the three measurements were given as a result of composition analysis. Then, it was found experimentally that the value obtained by the one measurement at the middle portion of the ingot, and the averages of the aforementioned three measurements are substantially the same. Accordingly, in Example 3, a result of the one measurement at the middle portion of the ingot was employed as a result of the composition analysis. As seen from Table 2, mixture of troublesome impurities was not recognized.

TABLE 2

| | Co (%) | Cr (%) | Pt (%) | Si (ppm) | Ni (ppm) | Fe (ppm) | Al (ppm) | Cu (ppm) |
|---|---|---|---|---|---|---|---|---|
| MASS RATIO | 52.74 | 7.29 | 39.96 | 360 | 33 | 61 | <10 | <10 |
| ATOMIC RATIO | 72.17 | 11.31 | 16.52 | — | — | — | — | — |

Example 4

A used target with a composition of 90(69Co-15Cr-16Pt)-7$TiO_2$-3$Cr_2O_3$ for a magnetic recording medium, containing metals and metal oxides, was employed, and the metals were recovered from the target. The metals and the metal oxides in the used target 3 were Co, Cr and Pt, and $TiO_2$ and $Cr_2O_3$. The volume fraction of the metal oxides ($TiO_2$+$Cr_2O_3$) with respect to the total volume of the target was 25.8 vol. %.

Figure 15:
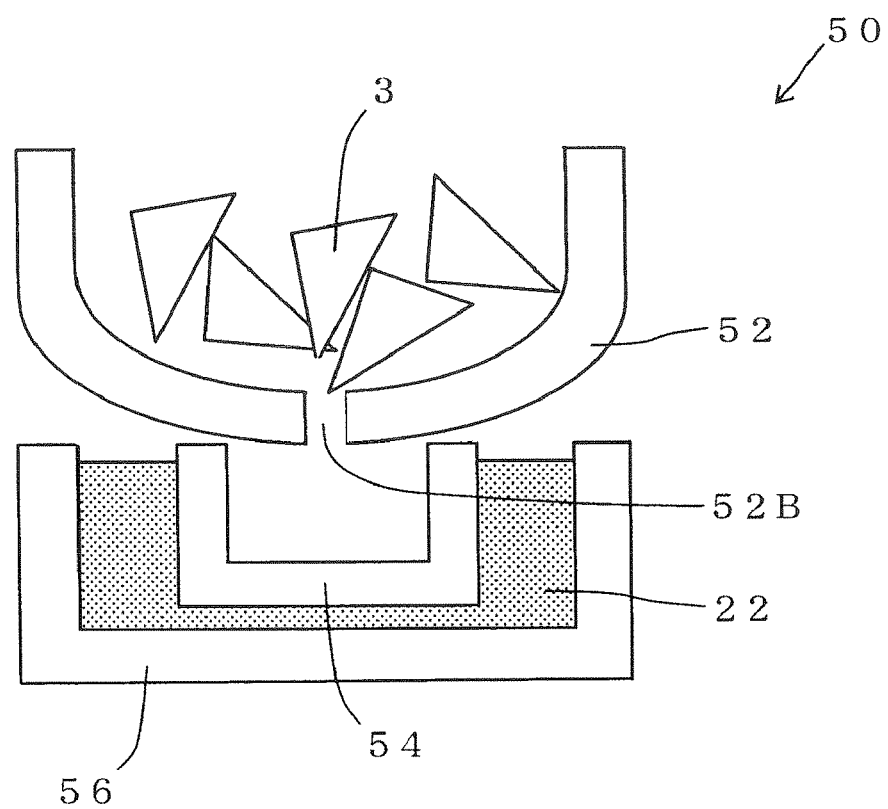
FIG. 15 is a cross sectional view schematically showing how a two-level crucible was used in Example 4.

A two-level crucible 50 shown in FIG. 15 was used for melting the metals by heating. An upper crucible 52, a lower crucible 54, and an outer crucible 56 are all made of MgO. The diameter of the through hole 52B in the upper crucible 52 was set at 5 mm. Further, a space between the lower and outer crucibles 54 and 56 was filled with a $ZrO_2$ powder 22.

The aforementioned used targets amounting to six in number were divided into portions of sizes of from about 5 cm×5 cm to about 10 cm×10 cm, and the divided portions were charged into the upper crucible 52 of the two-level crucible 50. The total mass of the targets 3 charged was 5544.25 g. After being charged into the upper crucible 52, the targets 3 were heated up to a temperature of 1600° C. at a rate of temperature rise of 10° C./min in a vacuum melting furnace, and were then held at this temperature for one hour. The temperature of 1600° C. at which the targets 3 were held was determined for the reason that the decomposition temperature of $TiO_2$ is 1640° C.

Figure 16:
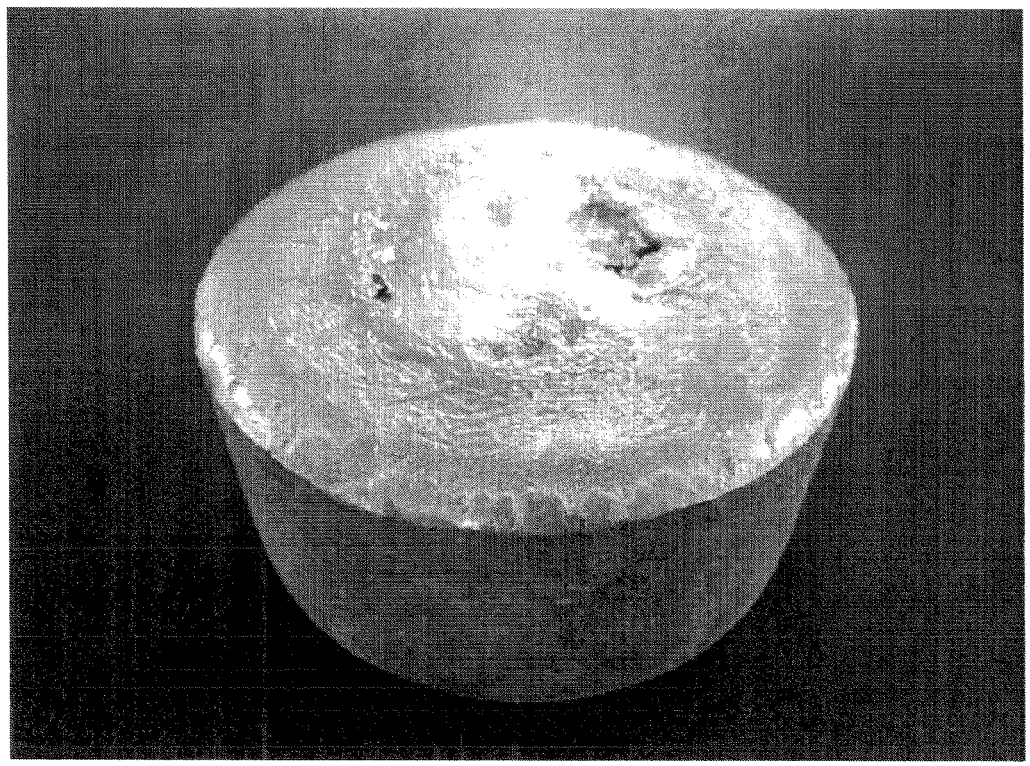
FIG. 16 is a photograph showing the appearance of an ingot obtained in Example 4.

Next, the two-level crucible 50 was furnace-cooled, and an ingot was obtained in the lower crucible 54. FIG. 16 is a photograph showing the appearance of the resultant ingot. The resultant ingot was in the form of a circular plate with a diameter of about 10 cm, a thickness of about 4.5 cm, and a mass of 3918.43 g. The total mass of the targets 3 charged into the upper crucible 52 was 5544.25 g, and the total mass of the metals contained in the used targets calculated from the composition was 4856.76 g. Accordingly, the recovery rate of the metals recovered from the charged targets was 80.68%. The ingot had metallic luster on its surface.

Table 3 shows the result of composition analysis of the resultant ingot, made by ICP. The result of the composition analysis shown in Table 3 was obtained as a result of one measurement made at a middle portion of the ingot. As seen from Table 3, contamination of troublesome impurities was not recognized.

Figure 17:
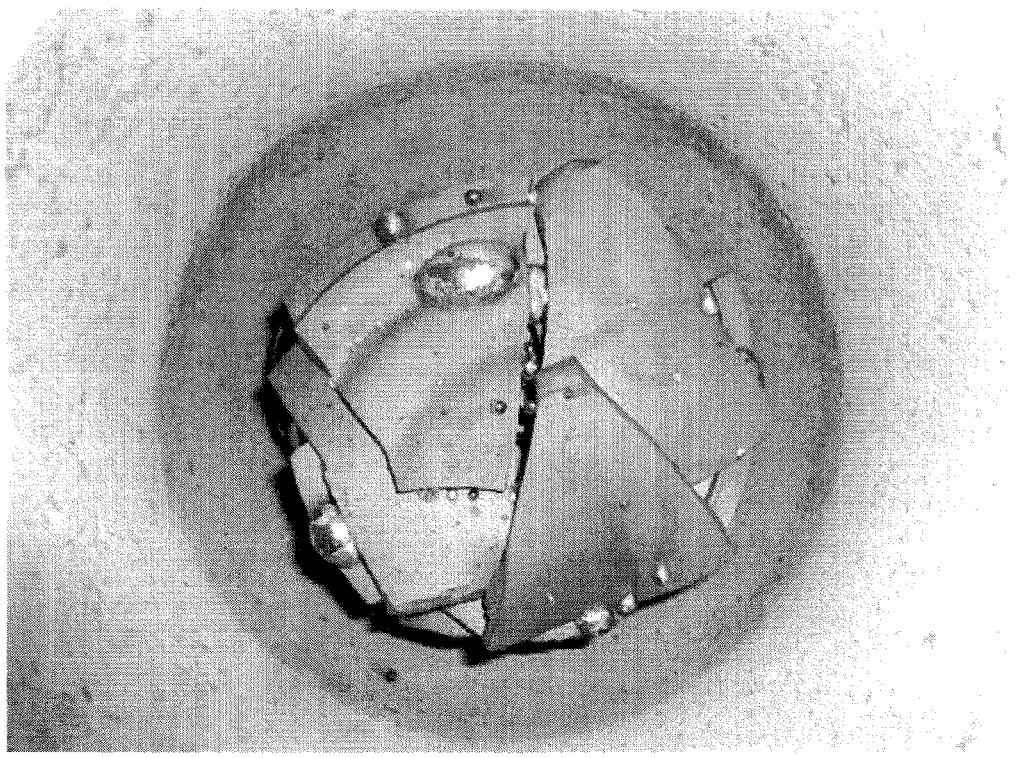
FIG. 17 is a photograph showing the appearance of used targets in an upper crucible after being subjected to heating in Example 4.

FIG. 17 is a photograph showing the appearance of the used targets in the upper crucible 52 after being heated at a temperature of 1600° C. for one hour in the vacuum melting furnace. The used targets charged into the upper crucible 52 maintained their shapes even after heating that are similar to those before heating (shapes defined by causing the targets before heating to contract isotropically in their planar directions by about 5 to 30%). As already described, it is considered that the metal oxides ($TiO_2$ and $Cr_2O_3$) in the used targets are subjected to heat sintering during formation of a target so as to become metal oxide sintered bodies. This may be the reason why the used targets charged into the upper crucible 52 could maintain their aforementioned similar shapes even after the metals in the targets were melted and then flowed from the used targets 3 into the lower crucible 54.

A sum of the masses of the metals collected in the lower crucible 54, and spherical and membranous metals exuded and solidified on target surfaces in the upper crucible 52 was about 95% of the total mass of the metals contained in the used targets charged into the upper crucible 52. This means that about 5% of the total mass of the metals contained in the used targets remains in the used targets from which the melted metals flowed. The remaining metals are considered to function as a binder to maintain the shapes of oxide sintered bodies in the used targets.

Example 5

A used target with a composition of 91(71Co-13Cr-16Pt)-$3SiO_2$-$3Cr_2O_3$-$3TiO_2$ for a magnetic recording medium, containing metals and metal oxides, was employed, and the metals were recovered from the target. The metals and the metal oxides in the used target were Co, Cr and Pt, and $SiO_2$, $Cr_2O_3$ and $TiO_2$. The volume fraction of the metal oxides ($SiO_2$+$Cr_2O_3$+$TiO_2$) with respect to the total volume of the target was 26.0 vol. %.

A crucible used for melting the metals by heating was the same as the two-level crucible 40 used in Example 2 (see FIG. 8).

The aforementioned used targets amounting to three in number were divided into portions of sizes of from about 5 cm×5 cm to about 10 cm×10 cm, and the divided portions were charged into the upper crucible 42 of the two-level crucible 40. The total mass of the charged targets was 3268.75 g. After being charged into the upper crucible 42, the targets were heated up to a temperature of 1600° C. at a rate of temperature rise of 10° C./min in a vacuum melting furnace, and were then held at this temperature for one hour. The temperature of 1600° C. at which the targets were held was determined for the reason that the decomposition temperature of $TiO_2$ is 1640° C.

TABLE 3

|  | Co (%) | Cr (%) | Pt (%) | Ti (ppm) | Ni (ppm) | Fe (ppm) | Al (ppm) | Cu (ppm) |
| --- | --- | --- | --- | --- | --- | --- | --- | --- |
| MASS RATIO | 52.27 | 7.43 | 40.30 | 35 | 22 | 58 | <10 | <10 |
| ATOMIC RATIO | 71.74 | 11.55 | 16.71 | — | — | — | — | — |

Figure 18:
FIG. 18 is a photograph showing the appearance of an ingot obtained in Example 5.

Next, the two-level crucible 40 was furnace-cooled, and an ingot was obtained in the lower crucible 44. FIG. 18 shows the appearance of the resultant ingot. The resultant ingot was in the form of a circular plate with a diameter of about 10 cm, a thickness of about 3 cm, and a mass of 2405.67 g. The total mass of the used targets charged into the upper crucible 42 was 3268.75 g, and the total mass of the metals contained in the used targets calculated from the composition was 2917.03 g. Accordingly, the recovery rate of the metals recovered from the charged targets was 82.47%. The resultant ingot had metallic luster on its surface.

Table 4 shows the result of composition analysis of the resultant ingot, made by ICP. The result of the composition analysis shown in Table 4 was obtained as a result of one measurement made at a middle portion of the ingot. As seen from Table 4, contamination of troublesome impurities was not recognized.

TABLE 4

|  | Co (%) | Cr (%) | Pt (%) | Si (ppm) | Ti (ppm) | Ni (ppm) | Fe (ppm) | Al (ppm) | Cu (ppm) |
| --- | --- | --- | --- | --- | --- | --- | --- | --- | --- |
| MASS RATIO | 53.11 | 7.14 | 39.75 | 370 | 28 | 22 | 57 | <10 | <10 |
| ATOMIC RATIO | 72.54 | 11.06 | 16.40 | — | — | — | — | — | — |

Figure 19:
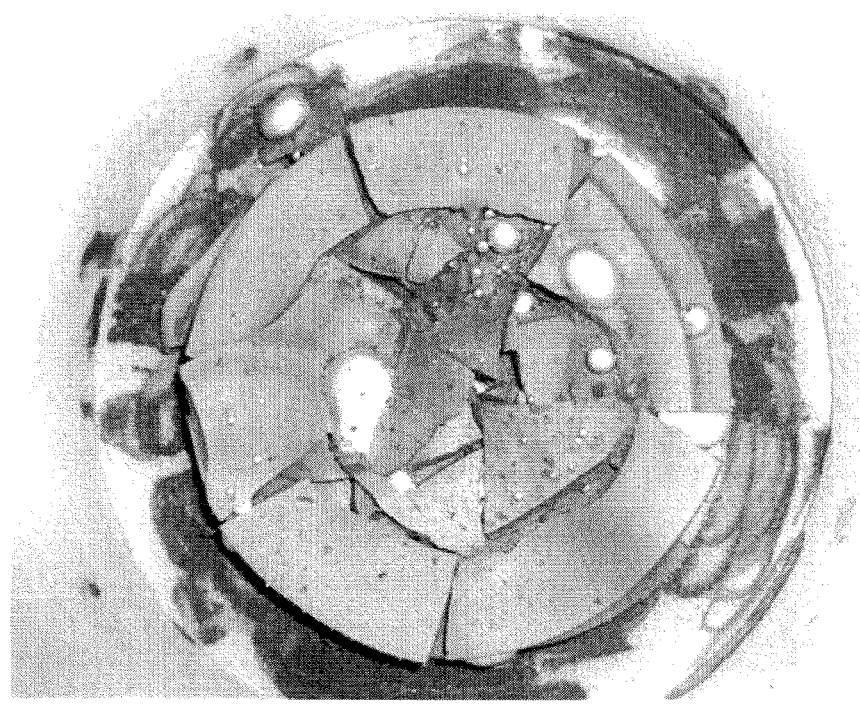
FIG. 19 is a photograph showing the appearance of used targets in an upper crucible after being subjected to heating in Example 5.

FIG. 19 is a photograph showing the appearance of the used targets in the upper crucible 42 after being heated at a temperature of 1600° C. for one hour in the vacuum melting furnace. The used targets charged into the upper crucible 42 maintained their shapes even after heating that are similar to those before heating (shapes defined by causing the targets before heating to contract isotropically in their planar directions by about 5 to 30%). As already described, it is considered that the metal oxides ($SiO_2$, $Cr_2O_3$ and $TiO_2$) in the used targets are subjected to heat sintering during formation of a target so as to become metal oxide sintered bodies. This may be the reason why the used targets charged into the upper crucible 42 could maintain their aforementioned similar shapes even after the metals in the targets were melted and then flowed from the used targets into the lower crucible 44.

A sum of the masses of the metals collected in the lower crucible 44, and spherical and membranous metals exuded and solidified on target surfaces in the upper crucible 42 was about 95% of the total mass of the metals contained in the used targets charged into the upper crucible 42. This means that about 5% of the total mass of the metals contained in the used targets remains in the used targets from which the melted metals flowed. The remaining metals are considered to function as a binder to maintain the shapes of oxide sintered bodies in the used targets.

[Consideration]

Table 5 below shows the recovery rates of metals from targets, heating temperatures, and the volume fractions of metal oxides in the targets of Examples 1 to 5 that are given in list form.

could not thoroughly ooze from the target while the viscosity of the melted metal was sufficiently low at a heating temperature of 1650° C. to allow the melted metal to thoroughly ooze from the target.

Further, in Examples 1 to 5, the volume fractions of the metal oxide in the targets are 24.9 to 26.0 (vol %). However, in all Examples 1 to 5, it was achieved to separate a metal from a target by heating in the upper crucible of a two-level crucible to melt the metal in the target, thereby causing the melted metal to flow into the lower crucible. In view of this, if the metal oxide is contained in the target in an amount corresponding to the volume fraction of the metal oxide in the target in Examples 1 to 5 or more, it is considered that some connections are formed between the metal oxide particles in the target to form a metal oxide sintered body.

INDUSTRIAL APPLICABILITY

The method for recovering a metal from a target according to the present invention can separate the metal in the target from the metal oxide with a small number of process steps and less contamination of impurities.

The method for manufacturing a target according to the present invention can manufacture a target with a small number of process steps and high recycling efficiency of metals.

TABLE 5

|  | COMPOSITION OF TARGET | TOTAL MASS OF TARGET (g) | TOTAL MASS OF METAL IN TARGET (g) | TOTAL MASS OF METAL RECOVERED (g) | RECOVERY RATE OF METAL (%) | HEATING TEMPERATURE (° C.) | VOLUME FRACTION OF METAL OXIDE (vol %) |
| --- | --- | --- | --- | --- | --- | --- | --- |
| EXAMPLE 1 | 92(70Co—10Cr—20Pt)—8SiO$_2$ | 5356.12 | 4841.93 | 4180.18 | 86.33 | 1650 | 24.9 |
| EXAMPLE 2 | 91.7(74.5Co—9.5Cr—16Pt)—8.3SiO$_2$ | 4986.34 | 4669.21 | 4005.25 | 85.78 | 1650 | 25.9 |
| EXAMPLE 3 | 92(70Co—14Cr—16Pt)—5SiO$_2$—3Cr$_2$O$_3$ | 5330.61 | 4832.20 | 4314.19 | 89.28 | 1650 | 25.6 |
| EXAMPLE 4 | 90(69Co—15Cr—16Pt)—7TiO$_2$—3Cr$_2$O$_3$ | 5544.25 | 4856.76 | 3918.43 | 80.68 | 1600 | 25.8 |
| EXAMPLE 5 | 91(71Co—13Cr—16Pt)—3SiO$_2$—3Cr$_2$O$_3$—3TiO$_2$ | 3268.75 | 2917.03 | 2405.67 | 82.47 | 1600 | 26.0 |

As seen from Table 5, in Examples 1 to 3 wherein the heating temperature was 1650° C., the recovery rates of the metals were high, i.e., 86.33%, 85.78%, and 89.28%, respectively. In Examples 4 and 5 wherein the heating temperature was 1600° C., the recovery rates of the metals were low, i.e., 80.68%, and 82.47%, respectively. It is considered that the viscosity of the melted metal was not sufficiently low at a heating temperature of 1600° C., and accordingly, the metal Reference Signs List

| | |
| --- | --- |
| 10, 40, 50 | two-level crucible |
| 12, 42, 52 | upper crucible |
| 12A | bottom portion |
| 12A1 | inner surface of bottom portion |

-continued

Reference Signs List

| | |
|---|---|
| 12B, 42B, 52B | through hole |
| 14, 44, 54 | lower crucible |
| 20 | outer crucible |
| 22 | $ZrO_2$ powder |
| 30 | single-level crucible |
| M1 | spherical metal |
| M2 | membranous metal |

The invention claimed is:

1. A method for recovering a metal from a target that contains a metal and a metal oxide,
wherein the target contains a sintered body of the metal oxide after being heated under a condition of melting the metal without melting or decomposing the metal oxide, and
the method comprising: heating the target in an upper crucible of a two-level crucible that includes the upper crucible with a through hole formed in a bottom surface thereof, and a lower crucible disposed below the through hole, a size of the through hole being set such that it does not allow the sintered body of the metal oxide contained in the target to pass therethrough; and
causing the melted metal to flow into the lower crucible, so that the metal is separated from the metal oxide.

2. The method for recovering a metal from a target according to claim 1, wherein
a size of the through hole is configured such that the through hole does not allow the target charged into the upper crucible to pass therethrough even after the target is caused to contract isotropically in its planar direction by 30%.

3. The method for recovering a metal from a target according to claim 1, wherein
a volume fraction of the metal oxide with respect to the total volume of the target is 20% or more.

4. The method for recovering a metal from a target according to claim 1, wherein
an inner surface of a bottom portion of the upper crucible has a downward convex shape.

5. The method for recovering a metal from a target according to claim 1, wherein
the lower crucible is smaller in internal volume than the upper crucible.

6. The method for recovering a metal from a target according to claim 1, wherein
the heating of the target is carried out in an inert atmosphere.

7. The method for recovering a metal from a target according to claim 1, wherein
the heating of the target is carried out with an electric resistance heater.

8. The method for recovering a metal from a target according to claim 1, wherein
the metal oxide contained in the target includes at least one or more of metal oxides of Si, Al, Cr, Co, B, Ti, Zr, Ta, W, Mg, Y, Sn, Zn, and In.

9. The method for recovering a metal from a target according to claim 1, wherein
the metal oxide contained in the target includes at least one or more of metal oxides of Si, Cr, Co, B, Ti, Zr, Ta, W, and Mg.

10. The method for recovering a metal from a target according to claim 1, wherein
the metal contained in the target includes at least one or more of Pt, Au, Ag, Ru, Rh, Pd, Ir, W, Co, Cr, Fe, Ni, Ta, Cu, B, and Mo.

11. The method for recovering a metal from a target according to claim 1, wherein
the target is a used target.

12. The method for recovering a metal from a target according to claim 1, wherein
the target is an unused target.

13. A method for manufacturing a target, comprising the step of obtaining a metal powder with a desirable composition by using a metal that is recovered from a target by applying the method for recovering a metal as claimed in claim 1.

14. The method for manufacturing a target according to claim 13, wherein
the metal powder with the desirable composition is obtained by re-melting the metal recovered by heating together with a metal the constituent of which is known.

15. A method for manufacturing a target, comprising the step of obtaining a metal powder by atomizing a metal in a melted state that is recovered from a target by applying the method for recovering a metal as claimed in claim 1.

16. The method for manufacturing a target according to claim 13, comprising the step of:
obtaining a powder mixture by mixing the resultant metal powder and a predetermined metal oxide powder.

17. The method for manufacturing a target according to claim 16, comprising the step of:
forming a sintered body of the resultant powder mixture.

18. The method for manufacturing a target according to claim 13, wherein
a target to be manufactured is a target for a magnetic recording medium.

19. The method for manufacturing a target according to claim 15, comprising the step of:
obtaining a powder mixture by mixing the resultant metal powder and a predetermined metal oxide powder.

20. The method for manufacturing a target according to claim 19, comprising the step of:
forming a sintered body of the resultant powder mixture.

21. The method for manufacturing a target according to 15, wherein
a target to be manufactured is a target for a magnetic recording medium.

* * * * *